US010777480B2

United States Patent
Liao et al.

(10) Patent No.: US 10,777,480 B2
(45) Date of Patent: Sep. 15, 2020

(54) SYSTEMS AND METHODS TO ENHANCE PASSIVATION INTEGRITY

(71) Applicant: Taiwan Semiconductor Manufacturing Co., Ltd., Hsin-Chu (TW)

(72) Inventors: Ying-Chieh Liao, Taipei (TW); Han-Wei Yang, Hsinchu (TW); Chen-Chung Lai, Guanxi Township (TW); Kang-Min Kuo, Zhubei (TW); Bor-Zen Tien, Hsinchu (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 16/705,469

(22) Filed: Dec. 6, 2019

(65) Prior Publication Data

US 2020/0111719 A1 Apr. 9, 2020

Related U.S. Application Data

(63) Continuation of application No. 16/218,842, filed on Dec. 13, 2018, now Pat. No. 10,515,866, which is a
(Continued)

(51) Int. Cl.
*H01L 23/528* (2006.01)
*H01L 23/31* (2006.01)
(Continued)

(52) U.S. Cl.
CPC .... *H01L 23/3171* (2013.01); *H01L 21/76802* (2013.01); *H01L 21/76804* (2013.01);
(Continued)

(58) Field of Classification Search
CPC ........... H01L 21/76804; H01L 23/4824; H01L 23/5226; H01L 23/5283; H01L 29/401; H01L 29/41
(Continued)

(56) References Cited

U.S. PATENT DOCUMENTS 4,962,414 A 10/1990 Liou et al.
5,109,267 A 4/1992 Koblinger
(Continued)

FOREIGN PATENT DOCUMENTS

JP 2005303140 A 10/2005
JP 2006235134 A 9/2006

OTHER PUBLICATIONS

Non-Final Office Action dated Nov. 19, 2014 for U.S. Appl. No. 13/974,400.
(Continued)

*Primary Examiner* — Stephen W Smoot
(74) *Attorney, Agent, or Firm* — Eschweiler & Potashnik, LLC

(57) ABSTRACT

Some embodiments relate to a semiconductor device. The semiconductor device includes a layer disposed over a substrate. A conductive body extends through the layer. A plurality of bar or pillar structures are spaced apart from one another and laterally surround the conductive body. The plurality of bar or pillar structures are generally concentric around the conductive body.

20 Claims, 10 Drawing Sheets

Related U.S. Application Data continuation of application No. 15/714,099, filed on Sep. 25, 2017, now Pat. No. 10,157,810, which is a continuation of application No. 15/146,012, filed on May 4, 2016, now Pat. No. 9,773,716, which is a continuation of application No. 14/791,555, filed on Jul. 6, 2015, now Pat. No. 9,349,688, which is a continuation of application No. 13/974,400, filed on Aug. 23, 2013, now Pat. No. 9,076,804.

(51) Int. Cl.
| | | |
|---|---|---|
| *H01L 23/00* | (2006.01) | |
| *H01L 23/48* | (2006.01) | |
| *H01L 21/768* | (2006.01) | |
| *H01L 23/482* | (2006.01) | |
| *H01L 23/522* | (2006.01) | |
| *H01L 29/40* | (2006.01) | |
| *H01L 29/41* | (2006.01) | |
| *H01L 23/29* | (2006.01) | |
| *H01L 23/532* | (2006.01) | |

(52) U.S. Cl.
CPC ...... *H01L 21/76877* (2013.01); *H01L 23/291* (2013.01); *H01L 23/3192* (2013.01); *H01L 23/481* (2013.01); *H01L 23/4824* (2013.01); *H01L 23/5226* (2013.01); *H01L 23/5283* (2013.01); *H01L 23/53228* (2013.01); *H01L 23/564* (2013.01); *H01L 29/401* (2013.01); *H01L 29/41* (2013.01); *H01L 2924/0002* (2013.01)

(58) Field of Classification Search
USPC .......................................... 257/773; 438/666
See application file for complete search history.

(56) References Cited

U.S. PATENT DOCUMENTS

| | | | |
|---|---|---|---|
| 5,633,781 A | * | 5/1997 | Saenger .............. H01L 27/1085 |
| | | | 257/296 |
| 6,448,641 B2 | | 9/2002 | Ker et al. |
| 6,590,295 B1 | | 7/2003 | Liao et al. |
| 6,649,517 B2 | | 11/2003 | Teh et al. |
| 6,660,630 B1 | | 12/2003 | Chang et al. |
| 8,389,402 B2 | | 3/2013 | Lin et al. |
| 9,076,804 B2 | | 7/2015 | Liao et al. |
| 9,349,688 B2 | | 5/2016 | Liao et al. |
| 2008/0023827 A1 | * | 1/2008 | Farooq .................... H01L 24/10 |
| | | | 257/737 |
| 2008/0265322 A1 | | 10/2008 | Lin et al. |
| 2012/0119260 A1 | | 5/2012 | Radulescu et al. |
| 2013/0049218 A1 | | 2/2013 | Gong et al. |

OTHER PUBLICATIONS

Notice of Allowance dated Mar. 2, 2015 for U.S. Appl. No. 13/974,400.
Notice of Allowance dated Jan. 29, 2016 for U.S. Appl. No. 14/791,555.
Non-Final Office Action dated Oct. 20, 2016 for U.S. Appl. No. 15/146,012.
Final Office Action dated Feb. 17, 2017 for U.S. Appl. No. 15/146,012.
Notice of Allowance dated May 30, 2017 for U.S. Appl. No. 15/146,012.
Non-Final Office Action dated Apr. 11, 2018 for U.S. Appl. No. 15/714,099.
Notice of Allowance dated Aug. 31, 2018 for U.S. Appl. No. 15/714,099.
Non-Final Office Action dated Aug. 7, 2019 for U.S. Appl. No. 16/218,842.
Notice of Allowance dated Oct. 31, 2019 for U.S. Appl. No. 16/218,842.

* cited by examiner

SYSTEMS AND METHODS TO ENHANCE PASSIVATION INTEGRITY

REFERENCE TO RELATED APPLICATIONS

This Application is a Continuation of U.S. application Ser. No. 16/218,842, filed on Dec. 13, 2018, which is a Continuation of U.S. application Ser. No. 15/714,099, filed on Sep. 25, 2017 (now U.S. Pat. No. 10,157,810, issued on Dec. 18, 2018), which is a Continuation of U.S. application Ser. No. 15/146,012, filed on May 4, 2016 (now U.S. Pat. No. 9,773,716, issued on Sep. 26, 2017), which is a Continuation of U.S. application Ser. No. 14/791,555, filed on Jul. 6, 2015 (now U.S. Pat. No. 9,349,688, issued on May 24, 2016), which is a Continuation of U.S. application Ser. No. 13/974,400, filed on Aug. 23, 2013 (now U.S. Pat. No. 9,076,804, issued on Jul. 7, 2015). The contents of the above-referenced Patent Applications are hereby incorporated by reference in their entirety.

BACKGROUND

Semiconductor device fabrication is a process used to create integrated circuits that are present in everyday electrical and electronic devices. The fabrication process is a multiple-step sequence of photolithographic and chemical processing steps during which electronic circuits are gradually created on a wafer composed of a semiconducting material. Silicon is an example of a typical semiconductor material used in the fabrication process, however other types of semiconductor materials can be utilized.

One layer often used in semiconductor devices is a passivation layer. Passivation layers are formed over other layers in order to protect the underlying layers from other materials utilized in the fabrication process, including solutions, gases, plasmas and the like. Any unwanted gaps or holes in passivation layers can result in damage to underlying layers.

DETAILED DESCRIPTION

Figure 1:
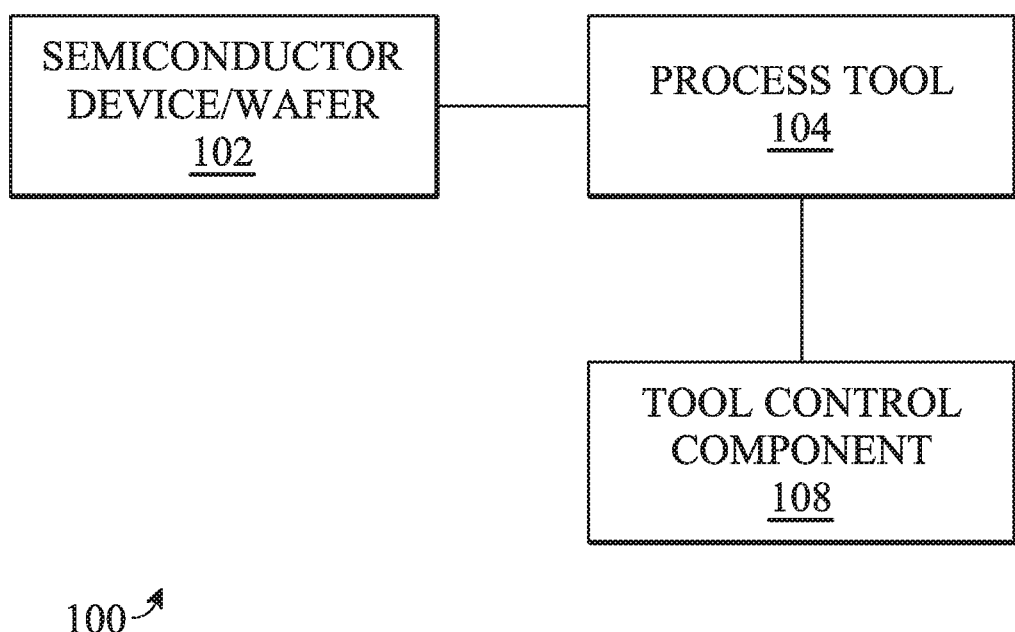
FIG. 1 is a block diagram illustrating an example semiconductor device fabrication system.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

Generally, semiconductor fabrication involves performing a relatively large number or process steps on a wafer or semiconductor material in order to produce a desired semiconductor integrated circuit. The fabrication process is a multiple-step sequence of photolithographic and chemical processing steps during which electronic circuits are gradually created on a wafer composed of a semiconducting material.

The process steps can be broken down into front end of line (FEOL) processing and back end of line (BEOL) processing. In one example, over 300 sequenced process steps are required to form an integrated circuit on a semiconductor wafer.

FIG. 1 is a block diagram illustrating a semiconductor device fabrication system 100. The system 100 can be utilized to remove nitride related precipitate from semiconductor devices during fabrication. The removal process utilizes phosphoric acid.

The system 100 includes a process tool 104 and a control component 106. The system operations on a semiconductor device or wafer 102. The semiconductor device 102 includes an oxide layer.

The process tool 104 can include one or more tools, temperature chambers, and the like that are utilized in semiconductor fabrication. The control component 106 initiates a process to enhance passivation coverage. In one example, the process utilizes modulation bars and a tapered hard mask to improve gap fill. In another example, the process uses a taper or step angle to enhance passivation coverage. Additional details are described in the methods below.

Figure 2:
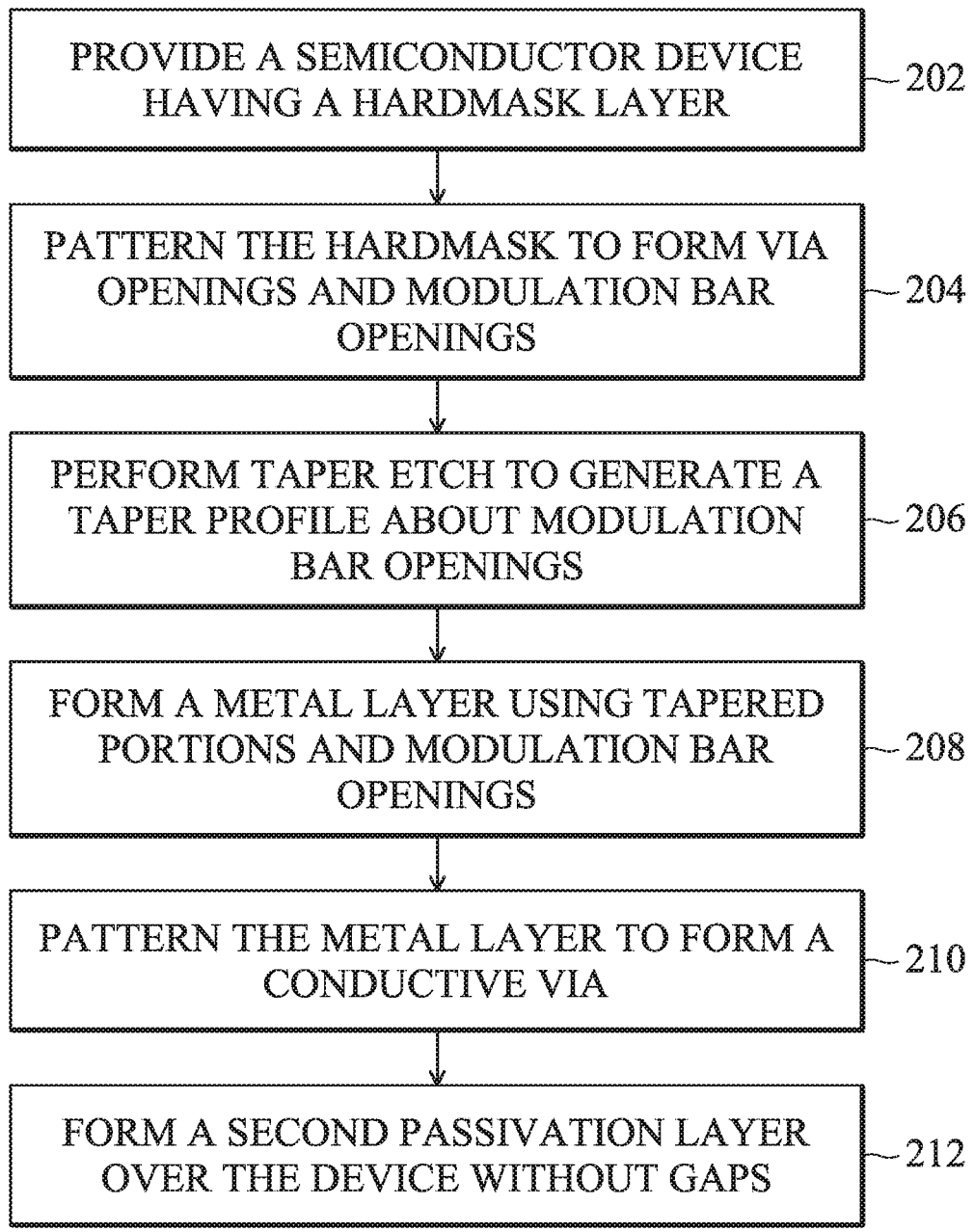
FIG. 2 is a flow diagram illustrating a method using a tapered profile and modulation bars/spacers to enhance passivation integrity.

FIG. 2 is a flow diagram illustrating a method 200 using a tapered profile and modulation bars/spacers to enhance passivation integrity. A hardmask layer is formed with a tapered profile and modulation bars prior to forming a metal layer. As a result, voids and the like in the metal layer are mitigated. Thus, a passivation layer can be formed over the metal layer with improved coverage. The method 200 mitigates gaps or holes in passivation layers, enhances coverage and, as a result, protects underlying layers.

The method 200 is described in conjunction with FIGS. 3A to 3H in order to facilitate understanding. However, it is appreciated that the extra figures are provided for illustrative purposes and are not intended to limit the method 200 to the arrangements shown therein. FIGS. 3A to 3H depict a semiconductor device fabricated using the method 200.

Figure 3A:
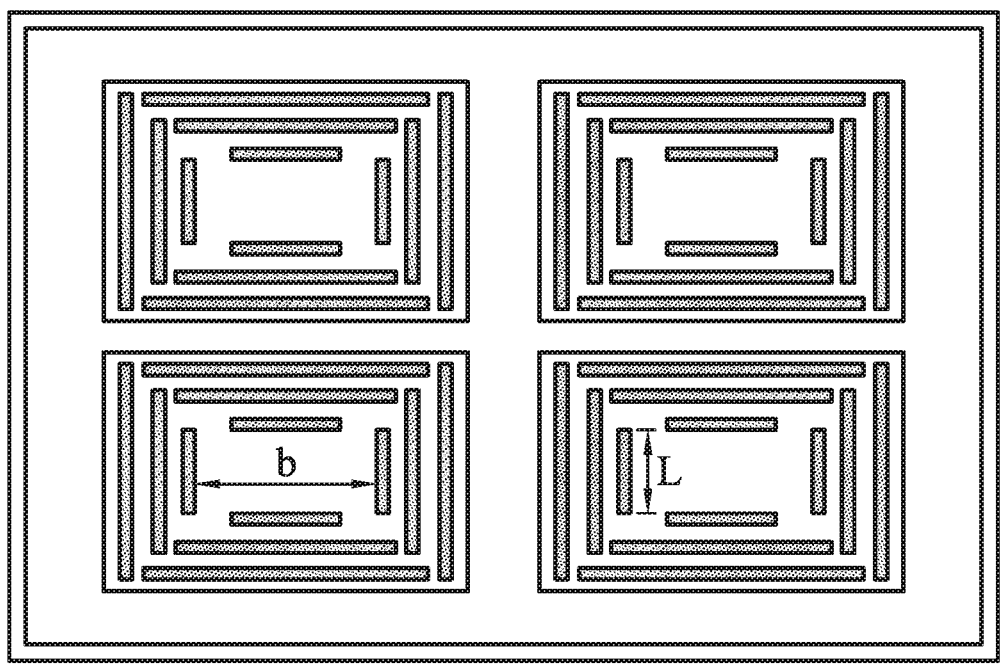
FIG. 3A is a top view of masks that can be utilized to fabricate the semiconductor device with enhanced passivation coverage for a conductive via.

FIG. 3A is a top view of masks 318 that can be utilized to fabricate the semiconductor device with enhanced passivation coverage for a conductive via. The masks 318 are utilized to form modulation bars within a hardmask layer, as shown below. The masks exhibit a larger corner angle at 320 to improve coverage rate. The masks also show and define a modulation bar length 'L' and a via hole width 'b'.

A semiconductor device having a substrate, a first passivation layer, and a hardmask is provided at block 202. The substrate can include one or more layers and/or structures. The substrate includes a TME layer. The first passivation layer is formed over or on the substrate. The first passivation layer is comprised of a passivation material, such as silicon nitride, silicon dioxide, and the like. The first passivation layer can be formed by a suitable deposition process, such as chemical vapor deposition, plasma enhanced chemical vapor deposition, and the like. The hardmask layer is formed over or on the first passivation layer.

Figure 3B:
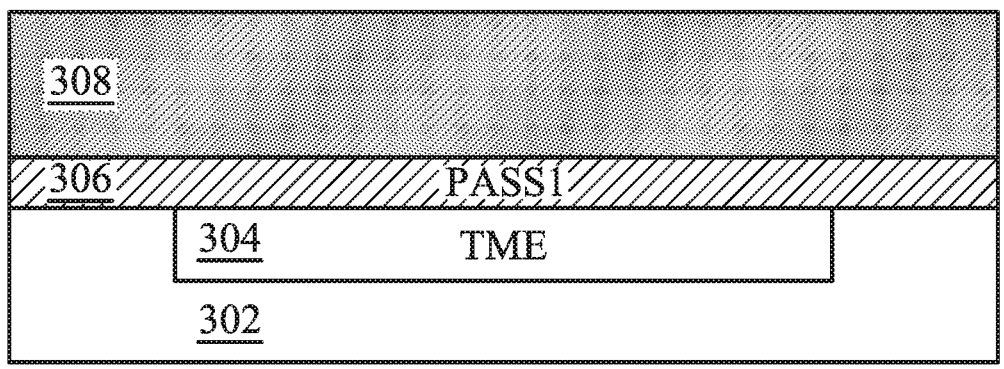
FIG. 3B is a cross sectional view of the semiconductor device fabricated using the method.

FIG. 3B is a cross sectional view of the semiconductor device fabricated using the method 200. The device is described as an example for illustrative purposes.

The device includes a substrate 302 having a TME layer 304 formed therein. A first passivation layer 306 is formed over the substrate 302. Additionally, a hardmask layer 308 is formed over the first passivation layer 306.

The hardmask layer is patterned at block 204 to form a via opening and modulation bar openings. The via opening exposes a portion of the underlying layer, the first passivation layer. The modulation bar openings expose modulation portions.

Figure 3C:
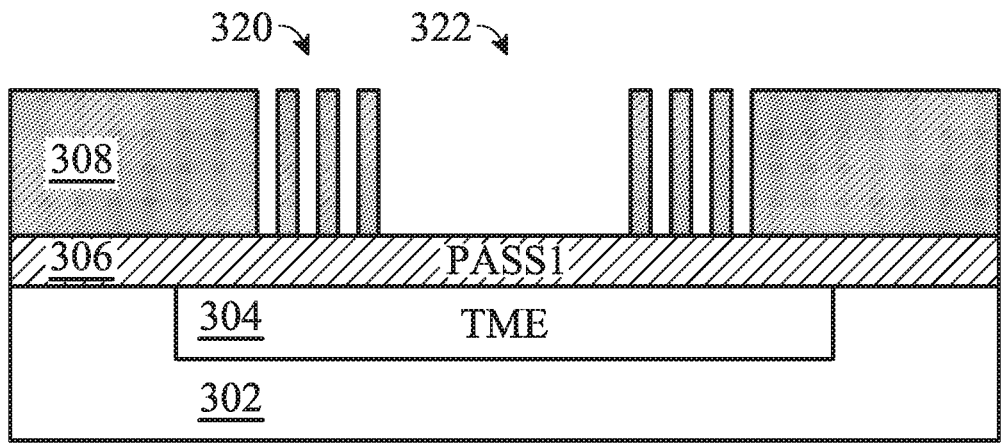
FIG. 3C is a cross sectional view of the semiconductor device after patterning the hardmask layer.

FIG. 3C is a cross sectional view of the semiconductor device after patterning the hardmask layer. The hardmask layer 308 has been patterned as described at block 204. The hardmask 308 includes a via opening 322 and modulation bar openings 320.

A taper etch is performed at block 206 in order to taper portions of the hardmask layer. The taper etch is performed at an angle such that portions closes to a via region are etched more than those further away. The taper etch uses modulate spacers and etch loading. The taper etch defines a tapered portion or ladder shaped film behavior; including a taper angle, via width, and a via height for the hardmask layer.

Figure 3D:
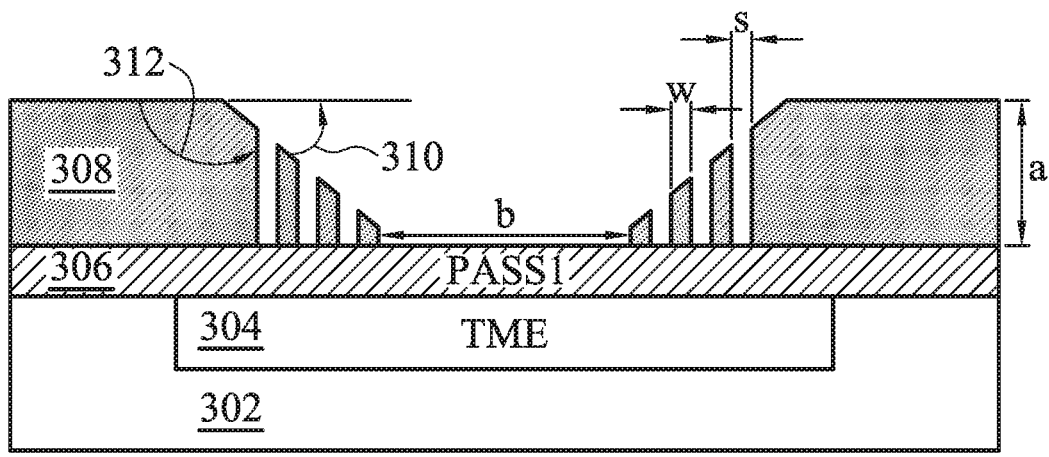
FIG. 3D is a cross sectional view of the semiconductor device after a taper etch of the hard mask layer.

FIG. 3D is a cross sectional view of the semiconductor device after a taper etch of the hard mask layer. The hardmask layer 308 was previously patterned at block 204. Here, the taper etch of block 206 forms tapered portions of the hardmask layer 308. The tapered portion is also referred to as a ladder shaped film. The taper etch defines a taper angle 312, which is greater than 90 degrees, and in another example, is greater than about 100 degrees. The taper angle 312 plus the angle 310 equal 180 degrees.

The taper etch also defines the via width 'b' and the via height 'a' for the hard mask layer. A spacing distance S of the modulation bars is shown as 'S'. A width of the modulation bars is shown as 'W'. These portions are identified in FIG. 3D.

An aspect ratio is defined as b/a, which in one example ranges from about 2 to 5. The via hole width 'b' is greater than or equal about 2 um in one example. The number of hardmask spacers, also referred to as modulation bars is greater than or equal 1. The space S in one example is greater than or equal to about 0.5 um. The width W of the modulation bars is greater than or equal to about 0.5 um. It is noted that the S and W can vary from each other. A modulation bar length 'L', shown in FIG. 3A, is within a range of about 0.5 um to about 2 um, in one example.

A metal layer is formed over the device at block 208. The metal layer is formed by a suitable metal deposition process, such as sputtering, and the like. The metal layer includes a metal material, such as AlCu, in one example. The modulation bars and tapered portions of the hardmask layer facilitate forming the metal layer properly, in particular within a via region.

Figure 3E:
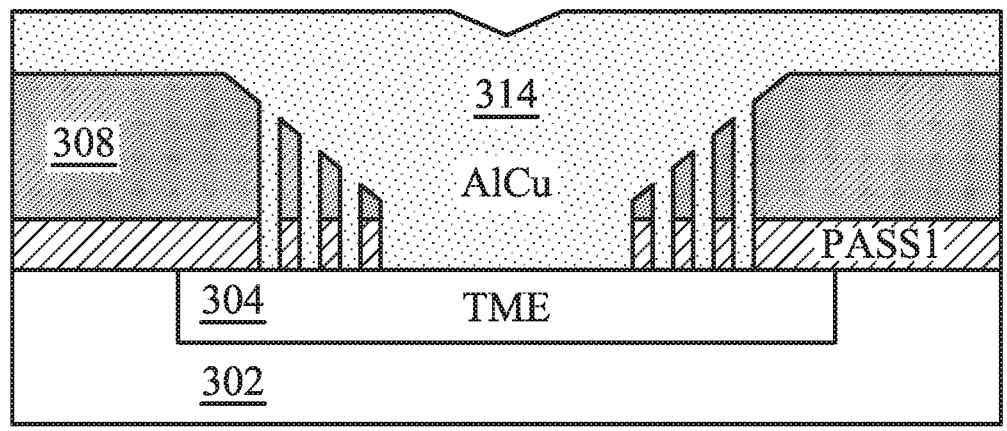
FIG. 3E is a cross sectional view of the semiconductor device after formation of a metal layer.

FIG. 3E is a cross sectional view of the semiconductor device after formation of a metal layer. The metal layer 314 is shown formed over the device. In this example, the metal layer 314 is comprised of AlCu. It can be seen that portions of the metal layer 314 extend through the hardmask 308 modulation bars and the first passivation layer 306 and down to the underlying substrate 302 and the TME 304.

The metal layer is patterned using a layer of resist to form a conductive via at block 210. A layer of resist is formed and utilized with a suitable patterning process to remove portions of the metal layer. The remaining portion forms the conductive via. A suitable metal patterning process is utilized. It is appreciated that other suitable patterning processes can be utilized.

Figure 3F:
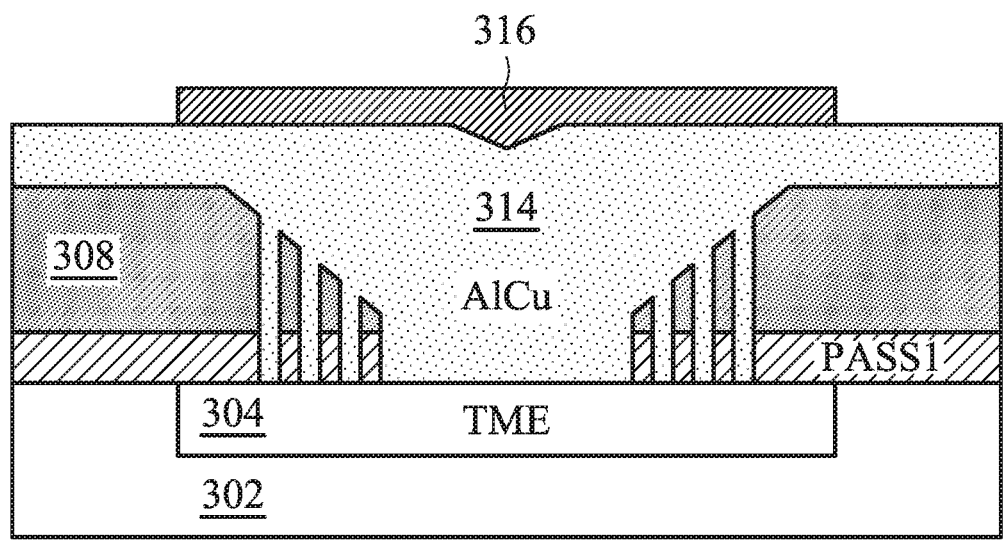
FIG. 3F is a cross section view of the semiconductor device having a layer of photoresist covering a via portion of the metal layer.

FIG. 3F is a cross section view of the semiconductor device having a layer of photoresist covering 316 a via portion of the metal layer 314.

Figure 3G:
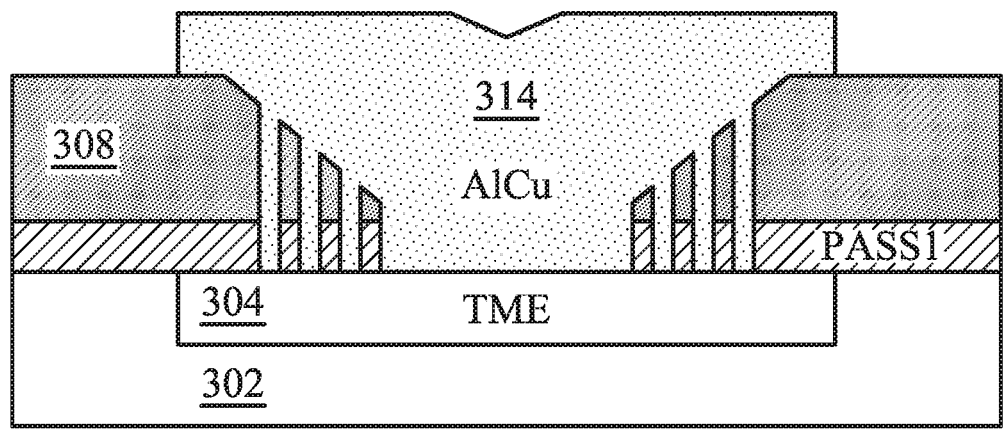
FIG. 3G is a cross sectional view of the semiconductor device after patterning the metal layer.

FIG. 3G is a cross sectional view of the semiconductor device after patterning the metal layer 314. The remaining portion of the metal layer 314 is a conductive via. The layer of resist 316 has also been removed.

A second passivation layer is formed over the device at block 212. The second passivation layer is also comprised of a suitable passivation material, such as silicon nitride, silicon dioxide, and the like. The passivation layer forms over the conductive via with a suitable or enhanced coverage rate. As a result, the passivation layer protects the underlying layers, including the conductive via.

In contrast, other techniques to form such passivation layers over conductive vias are problematic. The use of the modulation bars and tapered portions mitigate creation of voids or gaps within the conductive via. The voids or gaps prevent proper formation of the passivation layer and permit damaging of underlying layers.

Figure 3H:
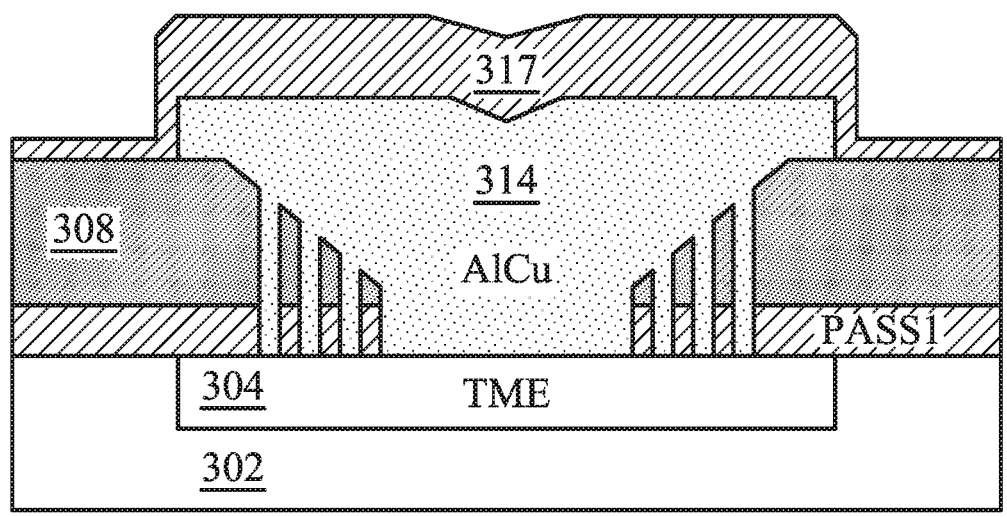
FIG. 3H is a cross sectional view of the semiconductor device after formation of another passivation layer.

FIG. 3H is a cross sectional view of the semiconductor device after formation of another passivation layer. Here, a second passivation layer 317 is formed over the semiconductor device. It can be seen that the second passivation layer 317 covers all or substantially all portions of the remaining metal layer 314.

It is appreciated that variations in the method 200 are contemplated. The number, size and shape of hardmask modulation bars and the taper angle can vary. Further, additional blocks and/or processes can also be performed.

Figure 4:
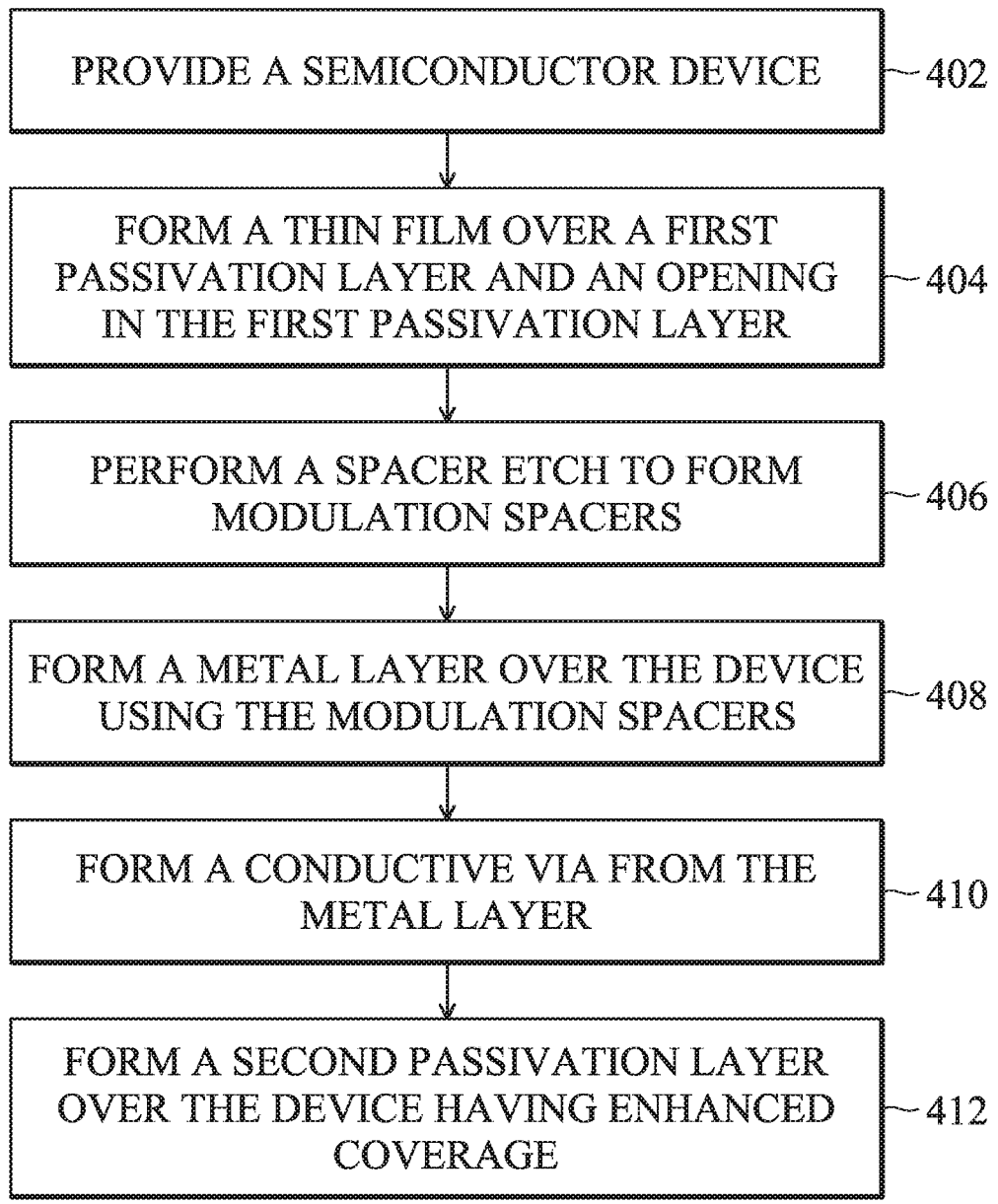
FIG. 4 is a flow diagram illustrating a method utilizing a modulation spacer to increate a step angle and enhance passivation layer coverage rate.

FIG. 4 is a flow diagram illustrating a method 400 utilizing a modulation spacer to increate a step angle and enhance passivation layer coverage rate. The method 400 utilizes a modulation spacer prior to forming a metal layer to mitigate gaps and/or voids in the metal layer. Thus, a passivation layer formed over the metal layer has improved coverage and gaps in the passivation layer are mitigated.

The method 400 is described in conjunction with FIGS. 5A to 5F in order to facilitate understanding. However, it is appreciated that the extra figures are provided for illustrative purposes and are not intended to limit the method 400 to the arrangements shown therein. FIGS. 5A to 5F depict a semiconductor device fabricated using the method 400.

The method begins at block 402, wherein a semiconductor device is provided. The device includes a substrate, a TME layer, and a first passivation layer. The substrate can include one or more layers and/or structures. The substrate includes a TME layer. The first passivation layer is formed over or on the substrate. The first passivation layer is comprised of a passivation material, such as silicon nitride, silicon dioxide, and the like. The first passivation layer can be formed by a suitable deposition process, such as chemical vapor deposition, plasma enhanced chemical vapor deposition, and the like. A portion of the passivation layer overlying the TME layer is removed.

Figure 5A:
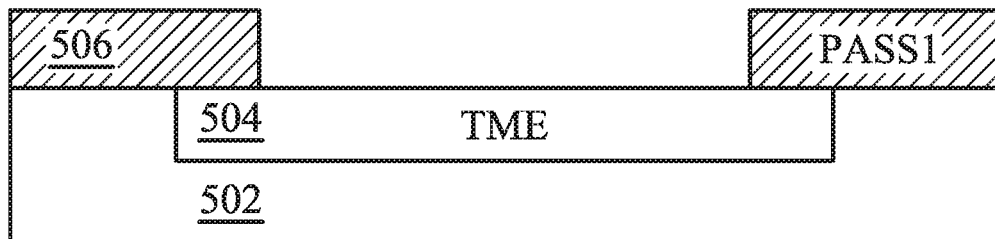
FIG. 5A is a cross sectional view of a semiconductor device fabricated using the method.

FIG. 5A is a cross sectional view of a semiconductor device fabricated using the method 400. The device is provided as an example in order to facilitate understanding. It is appreciated that other varied semiconductor devices are contemplated.

The device is provided as described in block 402. The device includes a substrate 502, which has a TME layer 504 formed therein. A first passivation layer 506 is formed over the substrate 502. It has an opening over at least a portion of the TME layer.

A thin film is formed over the device at block 404. The thin film has an etch rate varied from the first passivation layer. In one example, the thin film has a selective etch rate between the film and the first passivation layer larger than 1. In another example, the thin film is formed with a thickness of about 0.6 um.

Figure 5B:
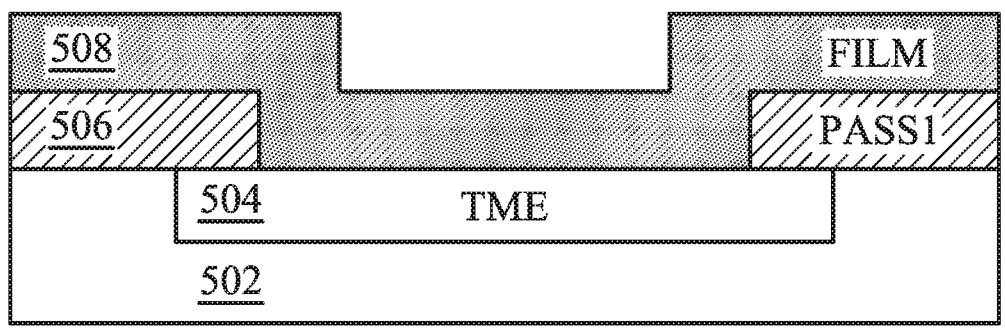
FIG. 5B is a cross sectional view of the semiconductor device after formation of a thin film over the device.

FIG. 5B is a cross sectional view of the semiconductor device after formation of a thin film 508 over the device. The thin film 508 is formed as described in block 404. The thin film 508 covers the first passivation layer 506 and portions of the TME layer 504.

A spacer etch is performed at block 406 to selectively remove portions of the thin film and leave modulation spacers. The modulation spacers are formed on edges or sidewalls of the first passivation layer and may also be referred to as tapered portions of the thin film. The modulation spacers have a spacer angle, typically larger than about 100 degrees. Additionally, there is a via distance between the spacers and on the TME layer.

The spacer etch, in one example, utilizes a selective etch rate between the thin film and the first passivation layer. The etch removes the thin film from a surface of the first passivation layer and a portion of the TME layer. As a result, the modulation spacers are formed.

Figure 5C:
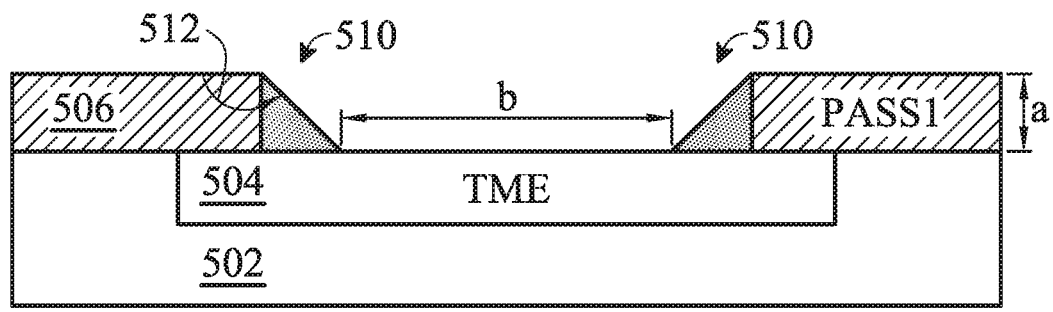
FIG. 5C is a cross sectional view illustrating the semiconductor device after formation of modulation spacers.

FIG. 5C is a cross sectional view illustrating the semiconductor device after formation of modulation spacers 510. It can be seen that the thin film 508 shown in FIG. 5B is substantially removed leaving the spacers 510. The film 508 was removed via the etch described in block 406.

The modulation spacers 510 are formed having a taper step angle 512 and a via width/distance 'b'. The spacers 510 have a spacer height 'a', which also matches a height of the first passivation layer 506. These values can vary upon implementation.

In one example, the via width 'b' is about 2 um. The aspect ratio b/a is about 2 to 5. The taper step angle is greater than about 100 degrees.

A metal layer is formed over the device at block 408. The metal layer is formed by a suitable metal deposition process, such as sputtering, and the like. The metal layer includes a metal material, such as AlCu, in one example. The modulation bars and tapered portions of the hardmask layer facilitate forming the metal layer properly, in particular within a via region.

Figure 5D:
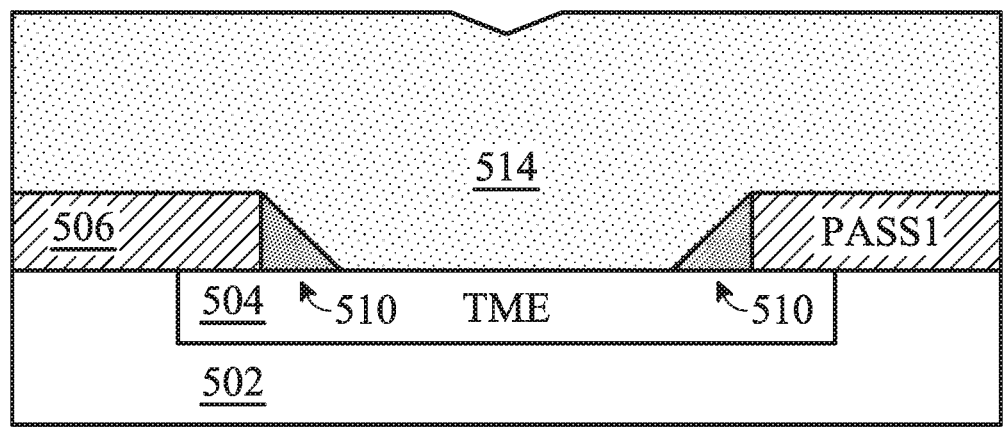
FIG. 5D is a cross sectional view of the semiconductor device after formation of a metal layer.

FIG. 5D is a cross sectional view of the semiconductor device after formation of a metal layer 514. In this example, the metal layer 514 is comprised of AlCu and is formed as described in block 408. It can be seen that portions of the metal layer 514 extend to a surface of the TME layer 504, to the first passivation layer 506 and to the modulation spacers 510.

The metal layer is patterned using a layer of resist to form a conductive via at block 410. A layer of resist is formed and utilized with a suitable patterning process to remove portions of the metal layer. The remaining portion forms the conductive via. A suitable metal patterning process is utilized. It is appreciated that other suitable patterning processes can be utilized.

Figure 5E:
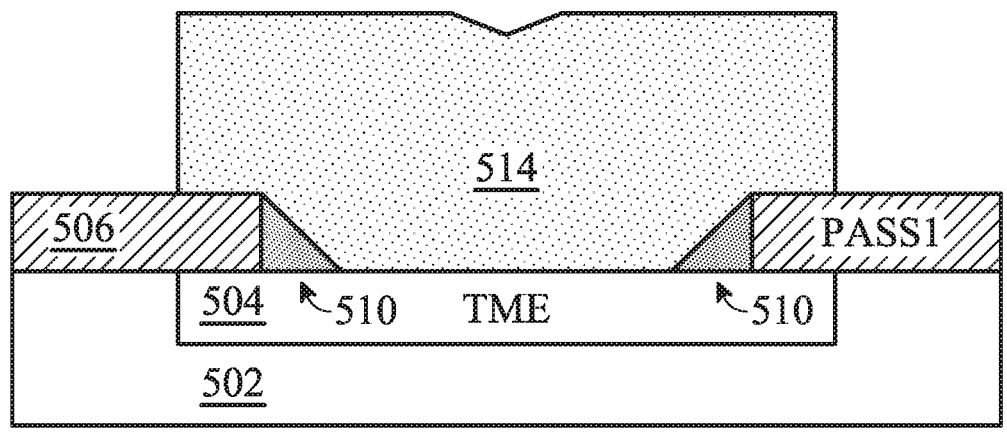
FIG. 5E is a cross sectional view of the semiconductor device after patterning the metal layer.

FIG. 5E is a cross sectional view of the semiconductor device after patterning the metal layer 514. The remaining portion of the metal layer 514 is a conductive via. A layer of resist used to pattern the metal layer 514 has been removed.

A second passivation layer is formed over the device at block 412. The second passivation layer is also comprised of a suitable passivation material, such as silicon nitride. The passivation layer forms over the conductive via with a suitable or enhanced coverage rate. As a result, the passivation layer protects the underlying layers, including the conductive via.

In contrast, other techniques to form such passivation layers over conductive vias result in poor coverage and result in gaps in the passivation layer. The use of the modulation spacers mitigate creation of voids or gaps within the conductive via. The voids or gaps prevent proper formation of the passivation layer and permit damaging of underlying layers.

Figure 5F:
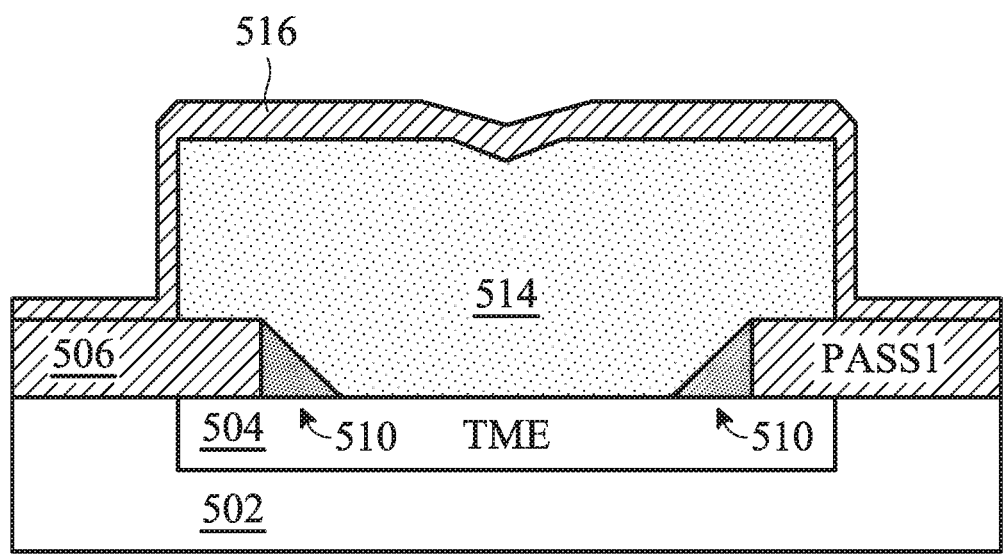
FIG. 5F is a cross sectional view of the semiconductor device after formation of a second passivation layer.

FIG. 5F is a cross sectional view of the semiconductor device after formation of a second passivation layer 516. It can be seen that the second passivation layer 516 covers all or substantially all portions of the remaining metal layer 514.

It is appreciated that suitable variations of the method 200 and 400 are contemplated.

It will be appreciated that while reference is made throughout this document to exemplary structures in discussing aspects of methodologies described herein (e.g., the structure presented in above figures, while discussing the methodology set forth in above), that those methodologies are not to be limited by the corresponding structures presented. Rather, the methodologies (and structures) are to be considered independent of one another and able to stand alone and be practiced without regard to any of the particular aspects depicted in the Figs.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

A semiconductor device having enhanced passivation integrity is disclosed. The device includes a substrate, a first layer, and a metal layer. The first layer is formed over the substrate. The first layer includes a via opening and a tapered portion proximate to the via opening. The metal layer is formed over the via opening and the tapered portion of the first layer. The metal layer is substantially free from gaps and voids. The first layer is a hardmask layer in one example. The first layer is a passivation layer in another example.

Another semiconductor device having enhanced passivation integrity is disclosed. The device includes a substrate, a hardmask layer, and a metal layer. The hardmask layer is formed over the substrate. The hardmask layer includes a via opening, a tapered portion proximate to the via opening, and modulation bar openings within the tapered portion. The metal layer is formed over the via opening and the tapered profile of the hardmask layer. The metal layer is substantially free from gaps and voids.

A method of fabricating a semiconductor device is disclosed. A substrate is provided. A first layer is formed over the substrate. A via opening and modulation bar openings are formed in the first layer. A tapered portion of the first layer about the modulation bar openings is generated. A metal layer is formed over the device using the tapered portion, the modulation bar openings, and the via openings. The metal layer is substantially free from gaps and voids.

Another method of fabricating a semiconductor device is disclosed. A substrate is provided. A hardmask layer is formed over the substrate. A via opening and modulation bar openings are formed in the hardmask layer. A tapered profile or portion is generated on the hardmask layer about the modulation bar openings. A metal layer is formed over the device using the tapered profile, the modulation bar openings and the via opening. The metal layer is substantially free from gaps and voids.

A method of fabricating a semiconductor device is disclosed. A substrate is provided. A first passivation layer is formed over the substrate. A hardmask layer is formed over the substrate. A via opening and modulation bar openings are formed in the hardmask layer. A metal layer is formed over the device using the modulation bar openings. The metal layer is substantially free of voids. The metal layer is patterned to form a conductive via. A second passivation layer is formed over the conductive via. The second passivation layer is free from gaps.

Another method of fabricating a semiconductor device is disclosed. A substrate is provided. A first layer is formed over the substrate. The first layer is patterned to define an opening. A thin film is formed over the device. A spacer etch is performed to remove portions of the thin film and leave modulation spacers at sidewalls of the opening. A metal layer is formed over the device using the modulation spacers to mitigate formation of gaps in the metal layer.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A semiconductor device, comprising:
   a substrate;
   a dielectric layer disposed over the substrate, the dielectric layer including an opening having a central axis, the opening being defined by inner sidewalls of the dielectric layer;
   a plurality of dielectric plate structures arranged in the opening and being generally concentric about the central axis; and
   a conductive body extending through the opening in the dielectric layer and separating neighboring dielectric plate structures of the plurality of dielectric plate structures from one another.

2. The semiconductor device of claim 1, wherein the plurality of dielectric plate structures have a plurality of heights, respectively, the plurality of heights being measured in a direction in parallel with the central axis.

3. The semiconductor device of claim 2, wherein the heights of the plurality of dielectric plate structures monotonically increase from the central axis to one of the inner sidewalls of the dielectric layer.

4. The semiconductor device of claim 2, wherein the plurality of dielectric plate structures are arranged in parallel with one another and in parallel with the central axis, and wherein bottommost surfaces of the plurality of dielectric plate structures are co-planar with one another.

5. The semiconductor device of claim 4, wherein the plurality of dielectric plate structures have a plurality of lengths, respectively, and a plurality of widths, respectively, and the plurality of lengths and the plurality of widths are measured in a plane perpendicular to the central axis.

6. The semiconductor device of claim 5, wherein innermost sidewalls of first and second dielectric plate structures of the plurality of dielectric plate structures are spaced apart by a first distance as measured in the plane, and the dielectric layer has a thickness as measured in the direction parallel to the central axis, and a ratio of the first distance to the thickness ranges from about 2 to 5.

7. A semiconductor device, comprising:
   a semiconductor substrate;
   an insulating layer disposed over the semiconductor substrate, the insulating layer including a via opening having a central axis, the via opening defined by inner sidewalls of the insulating layer;
   a plurality of vertical plate structures arranged in the via opening and being generally concentric about the central axis; and
   a conductive body extending downward between the inner sidewalls of the insulating layer and separating neighboring vertical plate structures of the plurality of vertical plate structures from one another.

8. The semiconductor device of claim 7, wherein the plurality of vertical plate structures are arranged in parallel with one another and in parallel with the central axis, and wherein bottommost surfaces of the plurality of vertical plate structures are co-planar with one another.

9. The semiconductor device of claim 8, wherein the plurality of vertical plate structures have a plurality of lengths, respectively, and a plurality of widths, respectively, and the plurality of lengths and the plurality of widths are measured in a first plane perpendicular to the central axis.

10. The semiconductor device of claim 9, wherein innermost sidewalls of first and second vertical plate structures of the plurality of vertical plate structures are spaced apart by a first distance as measured in the first plane, and the insulating layer has a thickness as measured in a direction parallel to the central axis, and a ratio of the first distance to the thickness ranges from about 2 to 5.

11. The semiconductor device of claim 9, wherein a length of a vertical plate structure is between 0.5 micrometers and 2 micrometers.

12. The semiconductor device of claim 9, wherein a width of a vertical plate structure is greater than or equal to 0.5 micrometers.

13. The semiconductor device of claim 7, wherein the central axis lies on a second plane that traverses the via opening, and wherein the second plane traverses four or more vertical plate structures of the plurality of vertical plate structures.

14. The semiconductor device of claim 7, wherein the central axis lies on a second plane that traverses the via opening, and wherein the second plane traverses only two vertical plate structures of the plurality of vertical plate structures.

15. The semiconductor device of claim 7, wherein the plurality of vertical plate structures includes at least twelve vertical plate structures that are spaced apart from one another by the conductive body.

16. The semiconductor device of claim 7, wherein the insulating layer includes an upper layer comprising a first dielectric material and a lower layer comprising a second dielectric material, the first dielectric material differing from the second dielectric material.

17. The semiconductor device of claim 16, wherein the upper layer has a tapered upper surface.

18. The semiconductor device of claim 7, wherein the plurality of vertical plate structures have the same material composition as the insulating layer.

19. A semiconductor device, comprising:
a substrate;
a first layer in the substrate;
a second layer disposed over an upper surface of the first layer;
a tapered structure disposed along inner sidewalls of the second layer, the tapered structure not covering a portion of the upper surface of the first layer;
a conductive body disposed over the tapered structure, the conductive body extending downwardly between inner sidewalls of the tapered structure to contact the portion of the upper surface of the first layer; and
a third layer disposed above the conductive body, wherein a lowest point of the third layer is equal to or above a highest point of the tapered structure.

20. The semiconductor device of claim 19, wherein the conductive body comprises aluminum or copper.

* * * * *